(12) United States Patent
Bergmann et al.

(10) Patent No.: US 7,476,981 B2
(45) Date of Patent: Jan. 13, 2009

(54) ELECTRONIC MODULE WITH LAYER OF ADHESIVE AND PROCESS FOR PRODUCING IT

(75) Inventors: Robert Bergmann, Regensburg (DE); Joachim Mahler, Regensburg (DE)

(73) Assignee: Infineon Technologies AG, Munich (DE)

( * ) Notice: Subject to any disclaimer, the term of this patent is extended or adjusted under 35 U.S.C. 154(b) by 150 days.

(21) Appl. No.: 10/505,066

(22) PCT Filed: Feb. 14, 2003

(86) PCT No.: PCT/DE03/00458

§ 371 (c)(1),
(2), (4) Date: Aug. 16, 2005

(87) PCT Pub. No.: WO03/071596

PCT Pub. Date: Aug. 28, 2003

(65) Prior Publication Data

US 2006/0017069 A1    Jan. 26, 2006

(30) Foreign Application Priority Data

Feb. 18, 2002    (DE) ................................ 102 06 818

(51) Int. Cl.
*H01L 23/48* (2006.01)
*H01L 23/52* (2006.01)

(52) U.S. Cl. ........................ 257/783; 257/713; 257/789; 257/E23.018; 977/810

(58) Field of Classification Search ................ 257/778, 257/783, 713, E23.018, E23.107, 789
See application file for complete search history.

(56) References Cited

U.S. PATENT DOCUMENTS 5,454,601 A * 10/1995 Sekine et al. ............... 383/200
5,852,083 A    12/1998 Walsh et al.

(Continued)

FOREIGN PATENT DOCUMENTS

AU    9955293    1/2000
CA    2 432 701    6/2002

(Continued)

OTHER PUBLICATIONS

McCluskey P. et al., "Nanocomposite Materials Offer Higher Conductivity and Flexibility," IEEE, pp. 282-286, (1998).

(Continued)

*Primary Examiner*—Nitin Parekh
(74) *Attorney, Agent, or Firm*—Dicke, Billig, Czaja, PLLC

(57) ABSTRACT

The present invention relates to an electronic module having a layer of adhesive between metallic surfaces of components of the module. The metallic surfaces are arranged facing one another. The adhesive of the layer of adhesive includes agglomerates of nanoparticles, which form paths, surrounded by an adhesive base composition, in the adhesive base composition. Furthermore, the invention relates to a process for producing the module.

11 Claims, 3 Drawing Sheets

U.S. PATENT DOCUMENTS

| | | | |
|---|---|---|---|
| 5,891,366 A | | 4/1999 | Gruenwald et al. |
| 5,965,267 A | | 10/1999 | Nolan et al. |
| 6,143,862 A | * | 11/2000 | Blondel et al. .............. 528/310 |
| 6,255,738 B1 | * | 7/2001 | Distefano et al. ........... 257/788 |
| 6,423,576 B1 | * | 7/2002 | Hoffman .................... 438/118 |
| 6,538,801 B2 | * | 3/2003 | Jacobson et al. ............ 359/296 |
| 6,884,833 B2 | * | 4/2005 | Chheang et al. ............. 524/445 |
| 6,911,385 B1 | * | 6/2005 | Haubrich et al. ............ 438/610 |

FOREIGN PATENT DOCUMENTS

| | | |
|---|---|---|
| DE | 29 02 002 | 7/1980 |
| DE | 38 55 511 | 3/1997 |
| EP | 0 265 077 | 9/1987 |
| WO | WO 99/33106 | 7/1999 |

OTHER PUBLICATIONS

Fu, Y. et al., "Cluster Effects on Electrical Conductance of Isotropically Conductive Adhesive," IEEE, pp. 188-192 (2000).

Gaynes, Michael A. et al., "Evaluation of Thermally Conductive Adhesives for Bonding Heat Sinks to Electronic Packages," IEEE, pp. 765-771 (1993).

Kuhlman, Mark A. et al., "A Thermal Evaluation of Multichip Module (MCM) Materials and Designs," Eight IEEE Semi-Therm Symposium, pp. 110-118 (1992).

* cited by examiner

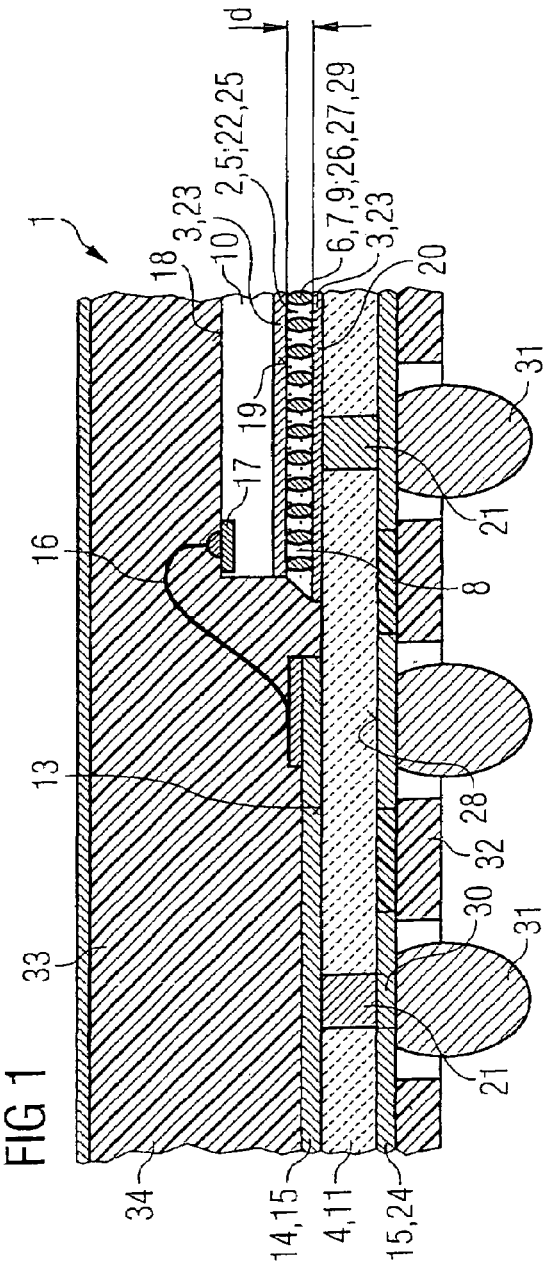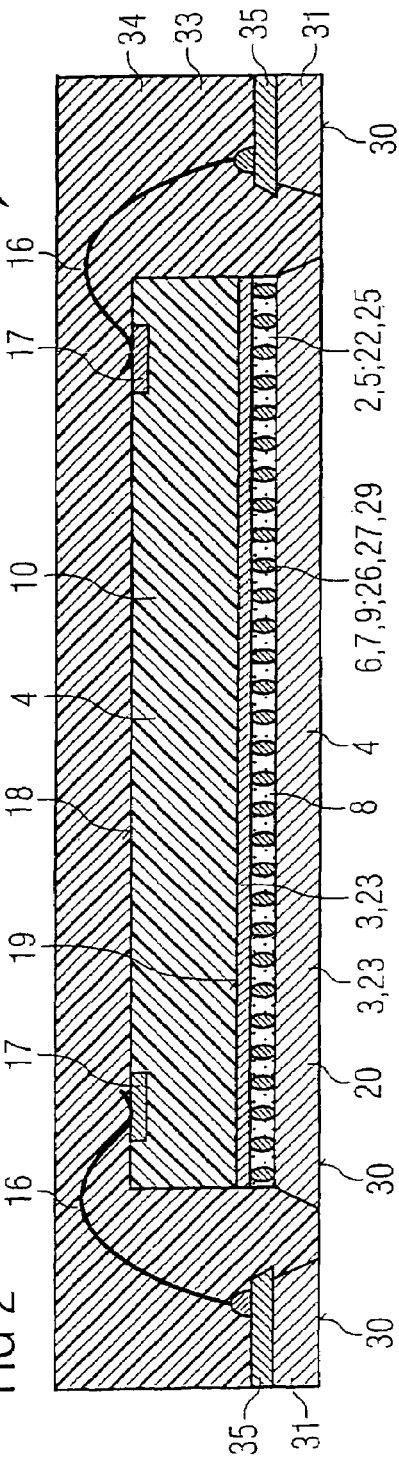

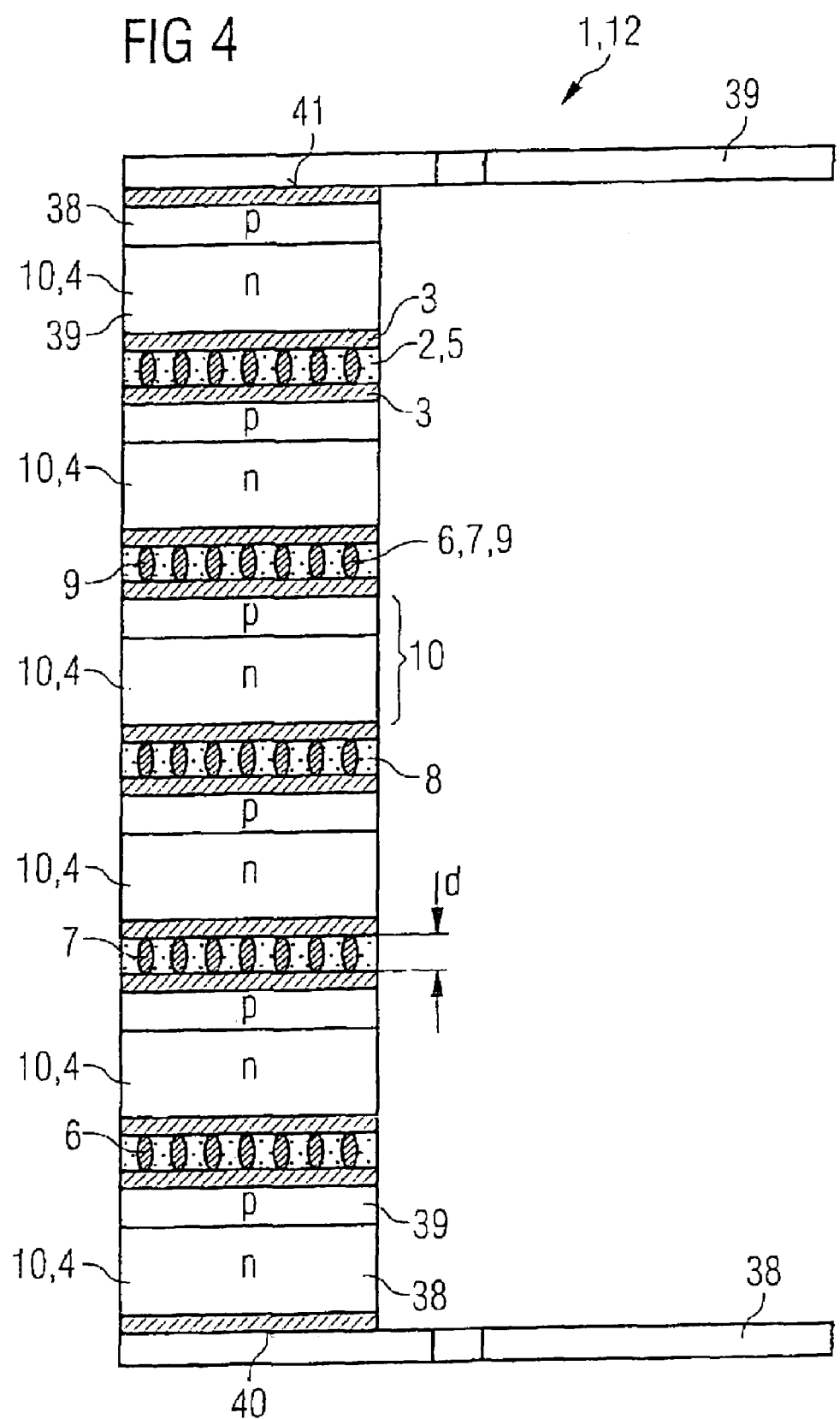

ELECTRONIC MODULE WITH LAYER OF ADHESIVE AND PROCESS FOR PRODUCING IT

CROSS REFERENCE TO RELATED APPLICATIONS

This Utility Patent Application claims the benefit of the filing date of German Application No. DE 102 06 818.6, filed Feb. 18, 2002, and International Application No. PCT/DE03/00458, filed Feb. 14, 2003, both of which are herein incorporated by reference.

BACKGROUND

The invention relates to an electronic module with layer of adhesive, and to a process for producing it.

Layers of adhesive in electronic modules are used for a very wide range of purposes. Electronic modules are known in which materials of a similar type, such as semiconductor chips, are mechanically joined via a layer of adhesive and stacked, or metallic surfaces are provided with corresponding metallic flat conductors, or wherein individual ceramic layers are adhesively bonded to form a multilayer ceramic substrate. Moreover, electronic modules are known in which materials of different types are joined to one another by means of a layer of adhesive, for example a semiconductor chip is joined to a metallic chip island, or a semiconductor chip is joined to a ceramic substrate or a metallic flat conductor is joined to a ceramic substrate.

The thermal and electrical properties of the layer of adhesive can be varied by admixing fillers into the layer of adhesive. Some electronic modules have electrically conductive layers of adhesive, and some electronic modules have electrically insulating layers of adhesive. One drawback of conventional layers of adhesive is that, despite having particulate fillers, they have completely isotropic properties with regard to the electrical conductivity and/or the thermal conductivity. On account of the isotropic electrical conductivity in an electrically conductive layer of adhesive, not only are metallic surfaces facing one another electrically connected to one another and short-circuited, but also electrically conductive surfaces arranged next to one another are short-circuited. The same drawback arises with layers of adhesive with an isotropic thermal conductivity, in which the thermal energy cannot be deliberately dissipated in one direction, but rather is transmitted uniformly in all directions.

A further drawback of filled layers of adhesive is their minimum thickness. Whereas the adhesive base composition of a layer of adhesive can be made as thin as desired, depending on the viscosity, with filled layers of adhesive which are intended to improve either the thermal properties or the electrical properties of the adhesive base composition, a thickness of 5 micrometers or more is required in order for the filler to be incorporated in a sufficient thickness and concentration in the adhesive base composition.

A further drawback of such thick filled layers of adhesive is that a meniscus is formed in the edge region, requiring increased area depending on the wetting properties and the adhesive thickness.

SUMMARY

One embodiment of the present invention provides an electronic module having a layer of adhesive and a process for producing it in which the above drawbacks are overcome and it is possible to reduce the space required and to improve the reliability of the layer of adhesive.

According to one embodiment of the invention, the electronic module has an electrically conductive layer of adhesive between metallic surfaces of components of the module. The metallic surfaces are in this case arranged facing one another. The adhesive of the electrically conductive layer of adhesive includes agglomerates of electrically conductive nanoparticles. These agglomerates are surrounded by an adhesive base composition and form electrically conductive paths in the adhesive base composition. The surfaces that face one another are electrically connected to one another in a punctiform manner via a multiplicity of agglomerates of electrically conductive nanoparticles which are randomly distributed in the polymer layer.

The formation of agglomerates of electrically conductive nanoparticles is promoted by the favorable ratio between the surface area of the nanoparticles and the volume of the nanoparticles. This property is achieved by virtue of the fact that the minimal dimensions of the particles, in the nanometer range, improve their mobility in the adhesive base composition. Moreover, their infinity for one another is greatly increased on account of the greater ratio between surface area and volume for nanoparticles compared to microparticles. Secondly, these agglomerates of nanoparticles in the adhesive base composition have the advantage that they can adapt themselves to the distance between opposite surfaces. A further advantage of a layer of adhesive of this type having agglomerates of electrically conductive nanoparticles is the anisotropy of the electrical conductivity in layers of adhesive.

Since each agglomerate is surrounded by an insulating adhesive base composition, isolated electrically conductive paths, which connect the electrically conductive surfaces that face one another to one another in a punctiform manner, result at the positions of the agglomerates. Electrically conductive surfaces which are arranged next to one another, however, are not short-circuited with one another on account of the isotropy of the layer of adhesive. Therefore, the layer of adhesive can successfully connect without any short-circuiting a plurality of metallic surfaces, arranged next to one another, of microscopically small dimensions, to metallic surfaces of corresponding dimensions arranged facing them. In this context, the term microscopically small is to be understood as meaning a dimension which can only be detected and measured under an optical microscope.

The electrically conductive nanoparticles include gold, silver, copper, nickel or alloys thereof. These nanoparticles of the corresponding noble metals and/or also of copper and its alloys have the advantage of being particularly successfully adsorbed, and consequently with a size in the order of magnitude of nanoparticles they tend to form agglomerates in an adhesive base composition. Furthermore, the metals gold, silver and copper have a high electrical conductivity.

On account of the electrically conductive nanoparticles, the thickness of the layer of adhesive may be less than one micrometer. Such a thin layer of adhesive not only improves the space requirement but also minimizes the area requirement, since a correspondingly small meniscus can form. At the same time, the electrical conductivity of the layer of adhesive is improved by a factor of over five compared to layers of adhesive containing electrically conductive microparticles.

Components with different coefficients of thermal expansion may differ in terms of their expansion coefficient by a factor of up to three without the risk of damage occurring in the event of fluctuating thermal loading of the electronic component, provided that the thickness of the layer of adhesive is a multiple of the mean diameter of the electrically conductive nanoparticles.

The nanoparticles may form between 30 and 95% by weight. This level of nanoparticles corresponds to a filling level of between approximately 4 and 70% by volume. This means at least 30% of the volume of the layer of adhesive consists of the insulating adhesive base composition, which ensures that the agglomerates of electrically conductive metallic nanoparticles are completely surrounded by the insulating adhesive base composition. In the case of layers of adhesive in electronic modules, an anisotropically electrically conductive structure is formed, with an insulating action in the plane of the layer of adhesive and an electrically conductive action orthogonally with respect to the layer of adhesive, i.e. over the thickness of the layer of adhesive.

In the electrically conductive layer of adhesive with electrically conductive nanoparticles, the agglomerates of nanoparticles in the adhesive base composition are deformable. On account of this deformability, the length of the conductive paths can be adapted to the corresponding thickness of the layer of adhesive, so that it is possible to compensate for differences in the distance between the electrically conductive surfaces facing one another. In particular in the case of semiconductor chips, the height or depth of the electrically conductive contact surfaces on the surface of the semiconductor chips is subject to considerable stagger, which means that this property of the electrically conductive agglomerates of nanoparticles being deformable is particularly suitable for connecting contact surfaces on the active top surfaces of the semiconductor chips to one another in an electrical module comprising stacked semiconductor chips.

The nanoparticles may have a mean diameter of between 10 and 200 nanometers. A mean diameter of from 10 to 50 nanometers is particularly suitable for extremely thin layers of adhesive with a thickness of much less than one micrometer, while the upper range of 100 to 200 nanometers is intended for layers of adhesive with thicknesses of approximately one micrometer. The use of electrically conductive nanoparticles with a mean diameter within these ranges between 10 and 200 nanometers therefore allows the electrically conductive layer of adhesive to be very accurately matched to the possible distance between the surfaces which face one another and are to be electrically connected to one another.

The mean diameter of the agglomerates of electrically conductive nanoparticles in the adhesive may be as much as the thickness of the layer of adhesive. This ensures that a reliable connection via suitable conduction paths which are formed from deformed agglomerates of electrically conductive nanoparticles in the layer of adhesive is produced in every region of the layer of adhesive.

As starting material, the adhesive may include a polyamide acetate which is enriched with electrically conductive nanoparticles and is dissolved in N-methylpyrrolidone. This starting material is such that the viscosity of the polyamide acetate dissolved in N-methylpyrrolidone can be varied by means of the proportion of N-methylpyrrolidone and can thereby be matched to the size of the nanoparticles.

In addition to the nanoparticles, the adhesive includes catalyst materials and adhesion promoters in an adhesive base composition formed from polyamide. In this context, polyamide is not adhesive on its own, and consequently in particular the addition of an adhesion promoter is responsible for the adhesive action of the polyamide base composition. Catalyst materials in this adhesive base composition are intended to help accelerate the crosslinking of the polyamide. Therefore, the additions of catalyst materials and adhesion promoter in combination with the electrically conductive nanoparticles result in an adhesive which has an improved adhesion and a higher crosslinking rate combined with a reduced crosslinking temperature.

At least one of the metallic surfaces facing one another may be arranged on a semiconductor chip. This enables the semiconductor chip and its metallic surfaces to be connected to metallic surfaces, for example of ceramic substrates, or directly to metallic chip islands of a leadframe using this adhesive.

Furthermore, at least one of the metallic surfaces which face one another and between which an electrically conductive layer of adhesive is to be arranged may be arranged on a ceramic substrate. Electronic modules in which at least one of the metallic surfaces has a ceramic substrate have the advantage over electronic modules in which, for example, metallic surfaces are arranged on a glass fiber-reinforced circuit board material that the coefficient of thermal expansion of a ceramic substrate is much closer to the expansion coefficient of a semiconductor chip. This allows the layer of adhesive to be formed with a thickness of less than one micrometer without delamination occurring as a result of thermal stresses.

The smallest thickness of a layer of adhesive can be used if the two components of an electronic module which are to be adhesively bonded to one another and electrically connected to one another consist of identical materials, since the layer of adhesive does not in any way have to form a buffer for the thermal expansion properties of the materials. A layer of adhesive comprising agglomerates of electrically conductive nanoparticles is therefore particularly suitable for use in stacks of semiconductor chips. A layer of adhesive of this type can also be used for stacks of individual ceramic layers which are intended to form a multilayer ceramic substrate. Therefore, by stacking materials of the same type and joining them using an adhesive comprising agglomerates of electrically conductive nanoparticles, it is possible to realize extremely compact, space-saving electronic modules.

A process for producing an electronic module having an electrically conductive layer of adhesive between metallic surfaces, which face one another, of components of the module includes the following process steps. First of all, a starting solution is produced by dissolving a polyamide acetate in N-methylpyrrolidone. Then, this starting solution is mixed with catalyst materials and adhesion promoters to form an adhesive solution. This adhesive solution is mixed with electrically conductive nanoparticles to form an electrically conductive adhesive. Then, the adhesive can be applied to at least one of the top surfaces of the components of the electronic module which are to be adhesively bonded, and then the components are joined together.

Finally, the adhesive crosslinks with heating and mechanically connects the components and, if the components have metallic surfaces facing one another, these metallic surfaces are connected to one another by the agglomerates of electrically conductive nanoparticles which form in the adhesive. With this process, it is possible to produce a layer of adhesive which has anisotropic properties in terms of the electrical conductivity. On account of the high specific surface area of the electrically conductive nanoparticles with respect to their volume, a high affinity is produced between the electrically conductive nanoparticles even during the mixing of the adhesive solution with electrically conductive nanoparticles, with the nanoparticles joining together to form agglomerates, the agglomerates being surrounded by the insulating adhesive solution on all sides.

When the adhesive is applied to at least one of the top surfaces of the components which are to be adhesively bonded in a thickness which is less than the mean diameter of the agglomerates, a layer of adhesive is prepared which electrically connects metallic surfaces facing one another, whereas metallic surfaces of the individual components located next to one another remain isolated from one another.

The temperature for crosslinking the adhesive is over 100° C., so that the components are heated to a temperature of this nature in order to crosslink the adhesive to form a secure bond. The crosslinking time and the crosslinking temperature can be reduced by the catalyst materials contained in the adhesive solution.

The metallic surfaces of the components which are to be electrically connected are oriented with respect to one another before the components are joined together. This step is made easier by the fact that the adhesive only has to be applied to one of the two top surfaces of the components which are to be adhesively bonded. During this application, the agglomerates of electrically conductive nanoparticles of gold, silver, copper, nickel or alloys thereof are arranged isolated from one another and in a random distribution in the layer of adhesive between those surfaces of the components which are to be electrically connected and have been oriented, prior to crosslinking.

The agglomeration of the electrically conductive nanoparticles allows a plurality of metallic surfaces which are arranged next to one another and are of microscopically small dimensions to be electrically connected, without any short-circuiting, to metallic surfaces, arranged facing them, of the components as soon as the two components have been joined together. If the components comprise semiconductor chips, these chips can be connected to form a stack of electrically conductive semiconductor chips. A stack of this type has a reduced overall height, especially since the agglomerated electrically conductive nanoparticles, depending on the viscosity of the adhesive base composition and the mean diameter of the electrically conductive nanoparticles, may form a layer of adhesive with a thickness of less than one micrometer.

A first embodiment of the invention realizes very low electrical resistances combined with high electrical conductivities while substituting solders if, in the context of this first embodiment of the invention, an electrically conductive adhesive comprising agglomerates of electrically conductive nanoparticles is used. The adhesive material can in this case be used to a limited extent as a buffer for differing thermo-mechanical expansions. The lower the difference in the coefficient of thermal expansion between the components of an electronic module, the more reliably it becomes possible for the components to be secured to one another with the aid of the adhesive according to the invention. This applies in particular to chip-on-chip connections if an electrical connection between the two chips is required. Furthermore, metallic surfaces as semiconductor chip islands on a ceramic substrate with semiconductor chips can be covered, and at the same time an electrically conductive layer of adhesive can be achieved.

A further embodiment of the invention relates to an electronic module having a thermally conductive and electrically insulating layer of adhesive between surfaces of components of the module. For this purpose, the surfaces are arranged facing one another. The adhesive of this layer of adhesive includes agglomerates of thermally conductive, electrically insulating nanoparticles. These agglomerates are surrounded by an adhesive base composition in which thermally conductive paths are arranged. These thermally conductive paths form thermal connections in a punctiform manner for the surfaces facing one another, with a multiplicity of these agglomerates being randomly distributed in the layer of adhesive.

A module of this type is such that when dissipating heat lost from the electronic components included in the electronic module, it can dissipate the heat in a direction which is predetermined by the layers of adhesive. This direction for heat dissipation in an electronic module can start from the active top surface of a semiconductor chip and be routed via corresponding metallic cooling surfaces to one of the outer sides of the electronic module. In this case, the semiconductor chip is secured to the metallic cooling surface with the aid of an electrically conductive and thermally insulating layer of adhesive.

Furthermore, it is possible for a plurality of metallic surfaces that are arranged next to one another and are of microscopically small dimensions to be thermally conductively connected, without any short-circuiting, to metallic surfaces, arranged facing them, of the components. In this way, even highly loaded interconnect structures can be thermally conductively connected to a heat sink of the electronic module via the layer of adhesive without short circuits being caused between the highly loaded interconnects by the metallic heat sink.

The intensity of the cooling provided by the heat sink of an electronic module of this type is oriented and improved with the aid of the thermally conductive and electrically insulating paths which occur in a punctiform manner.

In one embodiment, the electronic module includes, as thermally conductive and electrically insulating nanoparticles, particles of silicon dioxide, aluminum nitride, boron nitride, polytetrafluoroethylene or mixtures thereof. These nanoparticles have the advantage that, on account of their high specific surface area in relation to the particle volume, they combine with one another to form thermally conductive agglomerates with respect to the surrounding adhesive base composition. At least in the case of silicon dioxide, aluminum nitride and boron nitride, these agglomerates comprise thermally conductive ceramic particles which as their unit cell have in each case just two types of atoms and therefore have a high thermal coupling capacity. The improvement to the thermal conductivity of the adhesive base composition produced by polytetrafluoroethylene is substantially based on the crystalline nature of the tetrafluoroethylene comprising polymer products.

In one embodiment, the layer of adhesive, including its electrically insulating and thermally conductive nanoparticles, has a thickness of less than one micrometer. Such thin layers of adhesive cannot be achieved with microparticles with a mean diameter in the micrometer range. Furthermore, the ability to form agglomerates between particles on the micrometer scale is extremely low compared to nanoparticles, on account of the increased volume compared to the surface area.

With such thin layers of adhesive, the buffering compensation between the components consisting of materials with different coefficients of thermal expansion is limited, and consequently the coefficients of thermal expansion of the components may only differ by at most a factor of three. The smaller the difference in the coefficient of thermal expansion between the components, the thinner it is possible for a layer of adhesive comprising agglomerates of thermally conductive and electrically insulating nanoparticles to be.

In one embodiment, the electrically insulating and thermally conductive nanoparticles may form between 30 and 90% by weight of the layer of adhesive. Based on the abovementioned thermally conductive but electrically insulating materials with a relative density of between 2 and 3.3, the thermally conductive nanoparticles then produce between 4 and 70% by volume. Therefore, if the nanoparticles form between 30 and 95% by weight, a nonconductive, thermally insulating volume of adhesive base composition of from 30 to 95% by volume remains in the layer of adhesive, surrounding the individually thermally conductive paths formed from agglomerates of thermally conductive and electrically insulating nanoparticles. Therefore, in the case of layers of adhesive with a thickness of less than one micrometer, the result is a layer of adhesive with an anisotropic thermal conductivity.

In one embodiment, the thermally conductive and electrically insulating nanoparticles have a mean diameter of between 10 and 200 nanometers. Nanoparticle diameters of between 10 and 50 nanometers can be used for low-viscosity adhesive base compositions with a viscosity similar to that of water, whereas nanoparticles with a mean diameter of between 50 and 200 nanometers can be used successfully for thicker layers of adhesive which, at the same time, have a higher viscosity.

To produce a reliable, thermally conductive contact with the agglomerates of thermally conductive, electrically insulating nanoparticles in an adhesive or in a layer of adhesive, the mean diameter of the agglomerates is greater than the thickness of the layer of adhesive. This simultaneously ensures that each of the agglomerates which form contributes to the thermal conductivity between opposite surfaces. At the same time, these agglomerates have the property of being readily deformable such that they adapt to the distance between the two opposite surfaces which are to be thermally connected.

In addition to the thermally conductive and electrically insulating nanoparticles, an adhesive base composition also includes adhesive catalyst particles and adhesion promoters if the adhesive base composition used is a polyamide. Polyamides do not naturally have adhesive properties, and consequently an adhesive can only be formed by the adhesion promoter. The catalyst particles which are present in addition to the thermally conductive and electrically insulating nanoparticles serve to accelerate the crosslinking of the layer of adhesive to form a polyamide and to reduce the crosslinking temperature.

In one embodiment, the surfaces that face one another may be arranged on semiconductor chips if the electronic module includes a stack of semiconductor chips. However, it is also possible for at least one of the surfaces which face one another to belong to a semiconductor chip, while the other of the surfaces belongs to a ceramic substrate or a glass fiber-reinforced circuit board. In this case, it is possible for ceramic substrates to be connected to the semiconductor chip using very thin layers of adhesive with a thickness of less than one micrometer, especially since the difference in the expansion coefficient does not exceed a factor of three. However, problems arise with circuit board materials, since some circuit board materials far exceed the factor of three with regard to the expansion coefficient. In this case, there is a risk of delamination of the semiconductor chip from the circuit board.

A process for producing an electronic module having a thermally conductive layer of adhesive between surfaces, which face one another, of components of the module includes the following process steps. First of all, a starting solution is produced by dissolving a polyamide acetate in N-methylpyrrolidone. This starting solution is mixed with a catalyst material and with an adhesion promoter to form an adhesive solution. Thermally conductive and electrically insulating nanoparticles are then admixed to this adhesive solution. During this admixing, the high surface area to volume ratio of the nanoparticles results in the formation of agglomerates of electrically insulating and thermally conductive nanoparticles. The adhesive can then be applied to at least one of the top surfaces of the components of the electronic module which are to be adhesively bonded to one another. After the components have been joined together, the adhesive will then crosslink with heating of the components.

This process produces electronic modules that have components that are thermally connected to one another but electrically insulated from one another. The thermal connection is in this case effected via thermally conductive paths in the layers of adhesive connecting the components. An anisotropy in the thermal conductivity of this nature has the advantage that the heat can be deliberately dissipated into a direction from a heat-generating element in the electronic module toward the outer side of the electronic module and, for example, to a cooling plate without electrical short-circuiting occurring.

Crosslinking of the adhesive occurs at temperatures over 100° C.; this low temperature allows that the individual components of the module are not damaged by the action of heat.

If certain components are to be connected to one another in an electrically insulated but thermally conductive manner, the surfaces of the components are oriented toward one another before they are joined together.

Only after the surfaces which are to be thermally connected to one another have been accurately oriented with respect to one another can the adhesive crosslinking take place at the corresponding crosslinking temperature.

The electrically insulating and thermally conductive nanoparticles have agglomerated even before the crosslinking of the adhesive, so that when the surfaces which are to be adhesively bonded and thermally connected to one another are brought together, these agglomerates can be deformed, so that it is possible to produce thermally conductive paths between the locations which are to be connected. Prior to the crosslinking, these agglomerates arrange themselves in the polymer layer between the surfaces of the components which are to be thermally coupled in a form in which they are isolated from one another and distributed randomly, the thermally conductive nanoparticles substantially including silicon dioxide, aluminum nitride, boron nitride, polytetrafluoroethylene or mixtures thereof. The agglomerates can still be deformed and adapt to the distance between the surfaces facing one another. The agglomerates of thermally conductive and electrically insulating nanoparticles remain isolated from one another and therefore connect a plurality of metallic surfaces arranged facing one another without forming thermal bridges to adjacent surfaces.

One embodiment of the invention results in very low thermal resistances, since the adhesive bonds can be effected with very small layer thicknesses and just a low thermal resistance. In this case too, it is a condition that the components which are to be adhesively bonded, as substrates or as semiconductor chips, must not have excessively divergent coefficients of thermal expansion. The adhesive material for such a thin layer of adhesive has only a reduced buffer action for differing thermomechanical expansions. In this case too, the adhesive according to one embodiment of the invention and a layer of adhesive according to one embodiment of the invention can be used for chip-on-chip applications if an electrically insulating connection between the two chips is desired, and it is also possible for chips to be secured to semiconductor chip islands of a ceramic substrate, since in this case the differences between the coefficients of thermal expansion can be buffered by the thickness of the layer of adhesive. It is more difficult to adhesively bond materials with very different coefficients of thermal expansion, such as for example to adhesively bond a silicon semiconductor chip, at 3 ppm/K, to a circuit board, which has a coefficient of thermal expansion of between 15 and 30 ppm/K. In general, the reduced layer thickness compared to layers of adhesive with particles on a micrometer scale as filler reduces the materials costs by reducing the quantity of adhesive employed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a diagrammatic cross section through an electronic module of a first embodiment of the invention.

FIG. 2 illustrates a diagrammatic cross section through an electronic module of a second embodiment of the invention.

FIG. 4 illustrates a diagrammatic cross section through an electronic module of a fourth embodiment of the invention which includes a stack of a plurality of semiconductor chips.

DETAILED DESCRIPTION

Figure 3:
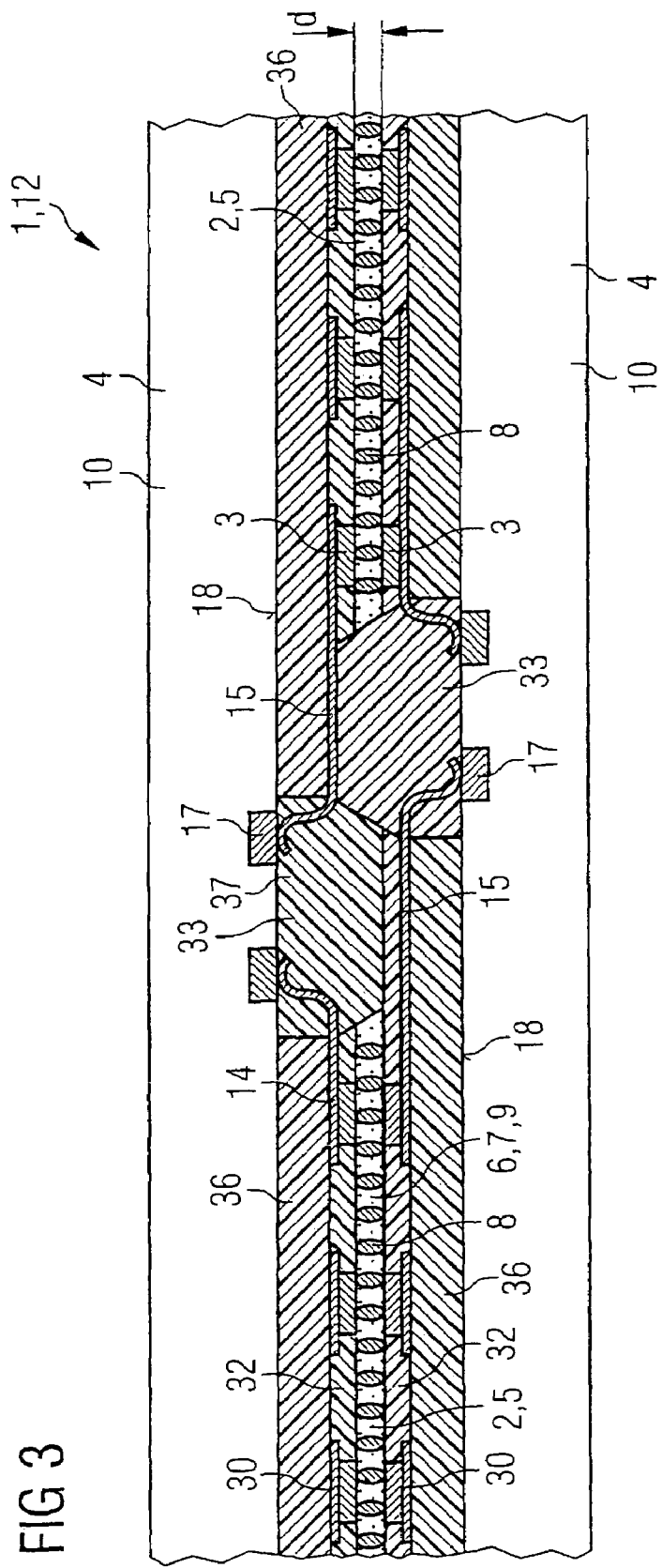
FIG. 3 illustrates a diagrammatic cross section through an electronic module of a third embodiment of the invention which includes a stack of two semiconductor chips.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a diagrammatic cross section through an electronic module 1 of a first embodiment of the invention.

Reference numeral 2 denotes a layer of adhesive which connects metallic surfaces 3 of two components 4 of the electronic module 1 to one another. Reference numeral 5 denotes an adhesive of the layer of adhesive 2, and reference numeral 6 denotes agglomerates which include nanoparticles 7. The agglomerates 6 are surrounded by an adhesive base composition in the adhesive 5 of the layer of adhesive 2. Paths whose electrical and thermal properties differ from the electrical and thermal properties of the surrounding adhesive base composition 8 extend through the layer of adhesive 2 within the agglomerates 6. Reference numeral 10 denotes one of the components 4 of the electronic module 1, in the form of a semiconductor chip. Reference numeral 11 denotes a ceramic substrate as second component 4, a metallic surface 3 of which is arranged facing the metallic surface 3 of the semiconductor chip 10.

On the top surface 13 facing the semiconductor chip, the ceramic plate 11 has a rewiring level 14, the rewiring lines 15 of which are connected, via bonding wires 16, to contact surfaces 17 on the active top surface 18 of the semiconductor chip 10. The back surface 19 of the semiconductor chip 10 is metalized and has the metallic surface 3. A semiconductor chip island 20, which is connected via a through-contact 21 to a rewiring level 24 on the underside 28 of the ceramic substrate 11, is arranged on the ceramic substrate 11 facing this metallic surface 3. The rewiring level 24 on the underside 28 of the ceramic substrate 11 includes, in addition to rewiring lines 15, external contact surfaces 30 on which external contacts 31 are arranged.

In this first embodiment of the invention, the external contacts 31 are balls of solder which protrude from the underside 28 of the ceramic substrate and are separated from one another by a soldering stop layer 32. To electrically connect the back surface of the semiconductor chip 10 to one of the external contacts 31, the layer of adhesive 2 is filled with electrically conductive nanoparticles 7. For one embodiment of the invention, the nanoparticles consist of electrically conductive material, such as gold, silver, copper, nickel or mixtures thereof. These electrically conductive nanoparticles, which take up to 70% by volume of the layer of adhesive, agglomerate, in the uncrosslinked state of the adhesive base composition 8 surrounding them, to form agglomerates 6 which are deformable in the uncrosslinked state of the adhesive 5 of the layer of adhesive 2. At the same time, these agglomerates 6 of electrically conductive nanoparticles 7, in one embodiment of the invention, form electrically conductive paths 9, so that the layer of adhesive acts anisotropically as an electrical connection between the metallic surfaces 3 facing one another. Whereas the layer of adhesive 2 has an insulating action in the horizontal direction, it connects the back surface of the semiconductor chip 10 to the metallic chip islands 20 of the ceramic substrate 11 across the layer thickness d of the layer of adhesive 2.

In another embodiment of the invention, this electrical connection is to be interrupted, and only a thermal connection to the chip island 20 is to be used in order to dissipate heat via the chip island 20 to the through-contact 21 and the external contact 31. In one embodiment, the nanoparticles 27 likewise form agglomerates 26, but the nanoparticles 27 are composed of electrically insulating but thermally conductive materials, such as silicon dioxide, boron nitride and polytetrafluoroethylene or mixtures thereof.

The nanoparticles 7 or 27 allow the thickness d of the layer of adhesive to be minimized to less than one micrometer. The mean diameter of the nanoparticles 7 or 27 is between 10 and 200 nanometers, while the mean diameter of an agglomerate 6 or 26 of nanoparticles 7 or 27 is greater than the layer thickness d. This produces a multiplicity of connection points, which are distributed randomly in the layer of adhesive 2, between the surfaces 3 or 23 facing one another. The deformability of the agglomerates 6 or 26 is utilized during production of the multiplicity of contact points, provided that the adhesive base composition has not yet been crosslinked. To crosslink the adhesive base composition, the components 10 and 11 are heated to a crosslinking temperature of over 100° C.

During production of an electronic module 1 of this type, first of all a ceramic substrate 11 having the rewiring levels 15 on the top surface 13 and the underside 28 and having through-contacts 21 is produced. In the region of the semiconductor chip 10 which is to be attached, a semiconductor chip island 20 is provided on the rewiring level 15, and an adhesive 5 filled with nanoparticles is applied to this semiconductor chip island 20. The adhesive 5 itself is produced form a starting solution in which a polyamide acetate is dissolved in N-methylpyrrolidone. Then, this starting solution is mixed with catalyst materials and adhesion promoters to form an adhesive solution. Finally, either electrically conductive or electrically insulating nanoparticles 7 or 27, respectively, are admixed to this adhesive solution. These nanoparticles 7 or 27 agglomerate to form larger agglomerates 6 or 26, respectively, the mean diameter of which is greater than the thickness of the layer of adhesive 2 which is to be produced.

Then, this adhesive 5 is applied to the semiconductor chip island 20, the semiconductor chip 10 is put in place and the ceramic substrate 11 together with the semiconductor chip 10 is exposed to a crosslinking temperature of over 100° C. After crosslinking of the adhesive 5, the bonding wire 16 can be bonded to the contact surfaces 17 on the active top surface 18 of the semiconductor chip 10 and connected to the rewiring lines 14 on the top surface 13 of the ceramic substrate 11. Then, a polymer potting compound 33 is applied to the top surface 13 of the ceramic substrate 11 so as to simultaneously encapsulate the semiconductor chip 10, the layer of adhesive 2 and the bonding wires 16. Finally, external contacts 31 are applied to the external contact surfaces 30 provided for them on the underside 28 of the ceramic substrate 11.

The soldering stop layer 32 may either be applied directly during production of the ceramic substrate 11 or may be applied to the underside 28 of the ceramic substrate 11 before the external contacts 31 are put in place, leaving clear the external contact surfaces 30. With the embodiment illustrated in FIG. 1, it is optionally possible for the semiconductor chip 10 either to be connected to the external contact 31 in an electrically insulating and thermal manner or to be connected to the external contact in an electrically conductive manner. For this purpose, it is merely necessary to select a suitable material for the nanoparticles 7 or 27 in the layer of adhesive 2.

FIG. 2 illustrates a diagrammatic cross section through an electronic module 1 of a second embodiment of the invention. Components having the same functions as in FIG. 1 are denoted by the same reference numerals and are not explained once again.

In this embodiment of the invention, the components 4 of the electronic module 1 are formed from a semiconductor chip 10 and a metallic chip island 20. The metallic chip island 20 simultaneously forms an outer side of the housing 34 of the semiconductor chip. The semiconductor chip island 20 may either serve as a ground contact, in which case the layer of adhesive 2 will include agglomerates 6 which comprise electrically conductive nanoparticles 7. However, if the back surface 19 of the semiconductor chip 10 is only to be thermally connected to a heat sink via the semiconductor chip island 20, while at the same time being electrically insulated from this heat sink, thermally conductive but electrically insulating nanoparticles 27, for example formed from silicon dioxide, boron nitride, aluminum nitride, polytetrafluoroethylene or mixtures thereof, are used for the layer of adhesive 2. The agglomeration of the nanoparticles 27 ensures that the thermal conductivity of the layer of adhesive 2 is anisotropic and is oriented in the direction toward the chip island 20 and therefore toward the heat sink.

To produce an electronic module 1 of this type, first of all the chip island 20 and the metalization cap provided for the outer contacts 31 are deposited by electroplating on a metal support (not shown). Then, the surface of the cap intended for the external contacts 31 is provided with a bondable coating 35. A bondable coating 35 of this type for its part includes a plurality of individual layers, namely a layer of nickel, which inhibits copper diffusion, directly on the cap for the external contact 30 made from copper, and then a noble metal layer on the nickel layer, for reliable bonding. Structuring of this nature has the advantage of preventing diffusion of copper ions into the connection to the bonding wire 16 and thereby suppressing premature embrittlement of the bonded join. It is then possible for the adhesive 5 to be applied to the chip island 20 in a thickness which is less than the mean diameter of the agglomerates of nanoparticles.

After the semiconductor chip 10 has been applied to the layer of adhesive 22 and the adhesive base composition has been crosslinked at a crosslinking temperature of over 100° C., the bonding wires 16 are applied to the contact surfaces 17 on the active top surface 18 of the semiconductor chip 10 and are connected to the bondable coating 35. Finally, the entire metal support (not shown) is covered with a polymer potting compound 33 which embeds both the layer of adhesive 2 and the semiconductor chip 10 and the bonding wires 16. The metal carrier (not shown) can then be etched away, producing the exemplary embodiment which is illustrated here in cross section. The adhesive 5 is produced in the same way as in the first exemplary embodiment, and consequently there is no need to list the production steps.

FIG. 3 illustrates a diagrammatic cross section through an electronic module 1 of a third embodiment of the invention, which includes a stack 12 of two semiconductor chips 10. Components which have identical functions to the previous figures are denoted by the same reference numerals and are not explained once again.

On their active top surface 18, the two semiconductor chips 10 have contact surfaces 17, and on this top surface they bear an insulating rewiring layer 36. Rewiring lines 15 are arranged on the insulating rewiring layer 36. These rewiring lines connect the contact surfaces 17 to metallic surfaces 3 on the insulating rewiring layer 36. The metallic surfaces 3 on the two semiconductor chips 10 are oriented and arranged in such a manner that they face one another. The bonding channels 37 of the two semiconductor chips 10, which have the contact surfaces 17, are arranged offset with respect to one another and are covered by a polymer potting compound 33. In the remaining region between the two semiconductor chips 10 there is arranged a layer of adhesive 2 formed from an adhesive 5 which has an anisotropic electrical conductivity. This anisotropic electrical conductivity is achieved by virtue of agglomerates 6 of electrically conductive nanoparticles 7 being arranged in an adhesive base composition 8.

The electrically conductive agglomerates 6 are isolated from one another by the adhesive base composition 8, so that the individual external contact surfaces 30, which face one another, are electrically connected via paths 9 through the agglomerates 6. However, there is no electrical connection between external contacts 30 located next to one another. Consequently, the adhesive 5 can be applied over a large area and in layers without having to selectively concentrate on the metallic surfaces 3 facing one another. Rather, the selectivity is effected automatically by the anisotropy of the electrically conductive layer of adhesive. Despite uniform application of the adhesive 5, the two semiconductor chips are connected by means of their corresponding external contact surfaces 30 and therefore by means of their contact surfaces 17 via the rewiring lines 15. As in the first embodiment, a soldering stop resist layer 32 between the external contact surfaces 30 can in each case ensure that the rewiring lines 14 remain insulated and that only corresponding external contact surfaces 30 are connected to one another via the electrically conductive agglomerates.

FIG. 4 illustrates a diagrammatic cross section through an electronic module 1 of a fourth embodiment of the invention, which includes a stack 12 of a plurality of semiconductor chips 10. Components bearing the same reference numerals as in the previous figures are denoted by the same reference numerals and are not explained once again.

In this embodiment of the invention, six similar components 4 of an electronic module 1 in the form of semiconductor chip diodes are stacked on top of one another. For this purpose, both the n-conducting cathode 38 and the p-conducting anode 39 are metalized on their respective outer sides, and then, for a cascade circuit of diodes of this type, the respective anode 39 is electrically connected to the cathode 38 of the next diode up by means of an electrically conductive layer of adhesive 2. For this purpose, the layer of adhesive includes agglomerates 6 of electrically conductive nanoparticles 7. As a result, an anisotropic connection is produced between the individual diodes by the layer of adhesive 2, the thickness d of which is less than one micrometer.

A flat conductor is arranged on the underside of the bottom diode, as a common cathode 38 of the diode cascade of this electronic module 1 and is modeled into a pin protruding from the diode cascade. In a corresponding way, a common anode 39 is placed on the top side 41 of the diode cascade and likewise structured so as to protrude to form a pin.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic module comprising:
    metallic surfaces of components of the module arranged facing one another;
    an electrically conductive layer of adhesive between the metallic surfaces, the adhesive including agglomerates of electrically conductive nanoparticles, surrounded by an adhesive base composition, wherein the nanoparticles have a mean diameter of between 10 and 200 nanometers;
    wherein the electrically conductive nanoparticles comprise electrically conductive paths in the adhesive base composition; and
    wherein the metallic surfaces that face one another are electrically connected in a punctiform manner via a multiplicity of agglomerates of electrically conductive nanoparticles, which are distributed randomly in the layer of adhesive.

2. The electronic module of claim 1, wherein the layer of adhesive electrically connects, without any short-circuiting, a plurality of metallic surfaces, which are arranged next to one another and are of microscopically small dimensions, to metallic surfaces arranged facing them.

3. The electronic module of claim 1, wherein the electrically conductive nanoparticles include one of the group comprising gold, silver, copper, nickel, and alloys thereof.

4. The electronic module of claim 1, wherein the layer of adhesive has a thickness of less than 1 micrometer.

5. The electronic module of claim 1, wherein the components have coefficients of thermal expansion that differ by at most a factor of three.

6. The electronic module of claim 1, wherein the layer of adhesive includes a proportion of nanoparticles of between 30 and 95 weight %.

7. The electronic module of claim 1, wherein the adhesive includes, as a starting material, a polyamide acetate which is enriched with nanoparticles and dissolved in N-methylpyrrolidone.

8. The electronic module of claim 1, wherein the adhesive includes catalyst materials and adhesion promoters in an adhesive base composition of polyamide in addition to the nanoparticles.

9. The electronic module of claim 1, wherein at least one of the metallic surfaces is arranged on a semiconductor chip.

10. The electronic module of claim 1, wherein at least one of the metallic surfaces is arranged on a ceramic substrate.

11. An electronic module comprising:
    metallic surfaces of components of the module arranged facing one another;
    an electrically conductive layer of adhesive between the metallic surfaces, the adhesive including agglomerates of electrically conductive nanoparticles surrounded by an adhesive base composition, wherein the mean diameter of the agglomerates of electrically conductive nanoparticles in the adhesive is greater than the thickness of the layer of adhesive;
    wherein the electrically conductive nanoparticles comprise electrically conductive paths in the adhesive base composition; and
    wherein the metallic surfaces that face one another are electrically connected in a punctiform manner via a multiplicity of agglomerates of electrically conductive nanoparticles, which are distributed randomly in the layer of adhesive.

* * * * *